United States Patent [19]

Malaviya

[11] 4,409,673
[45] Oct. 11, 1983

[54] SINGLE ISOLATION CELL FOR DC STABLE MEMORY

[75] Inventor: Shashi D. Malaviya, Fishkill, N.Y.

[73] Assignee: IBM Corporation, Armonk, N.Y.

[21] Appl. No.: 221,651

[22] Filed: Dec. 31, 1980

[51] Int. Cl.³ .............................................. G11C 11/34
[52] U.S. Cl. .................................................... 365/180
[58] Field of Search .............. 365/180, 181, 174, 177, 365/187, 188, 206; 307/238.2, 238.6, 238.1, 238.3, 305

[56] References Cited

U.S. PATENT DOCUMENTS 3,697,962 10/1972 Beausoleil ........................... 365/181
3,918,033 11/1975 Case et al. ........................... 365/180

OTHER PUBLICATIONS

Farley et al., "Integrated Static SCR Memory Cell", *IBM Technical Disclosure Bulletin*, vol. 22, No. 1, Jun. 1979, pp. 135, 136.
Malaviya, "Single-Device DC Stable Memory Cell", *IBM Technical Disclosure Bulletin*, vol. 20, No. 9, Feb. 1978, pp. 3492-3494.

*Primary Examiner*—John C. Martin
*Attorney, Agent, or Firm*—Pollock, Vande Sande & Priddy

[57] ABSTRACT

A fully selectable static memory cell formed in a single isolation region comprises a pair of word lines, an SCR latch including an NPN device and an associated parasitic PNP device connected between the word lines, and a pair of bit lines, each of which is connected to the NPN device and the PNP device either directly or through a Schottky diode or an additional transistor device.

16 Claims, 20 Drawing Figures

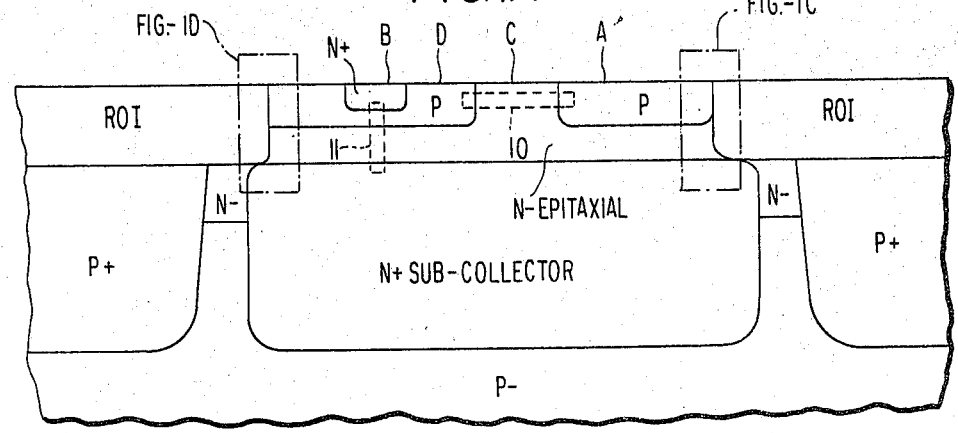
FIG.1A
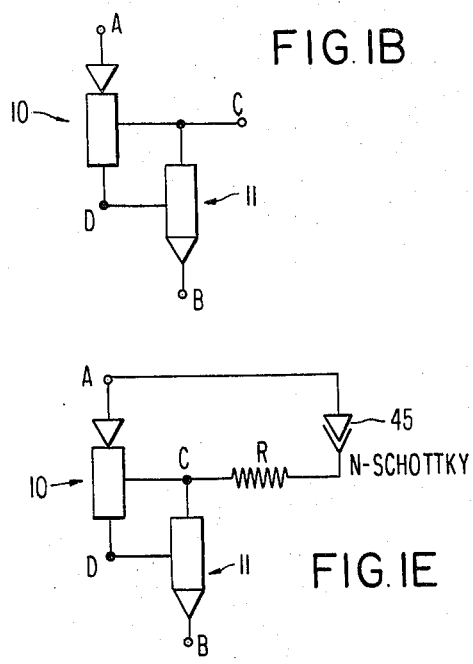
FIG.1B
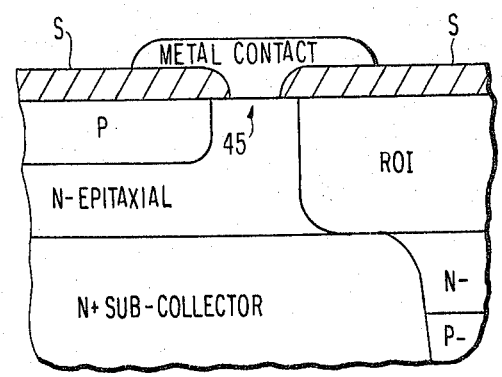
FIG.1C
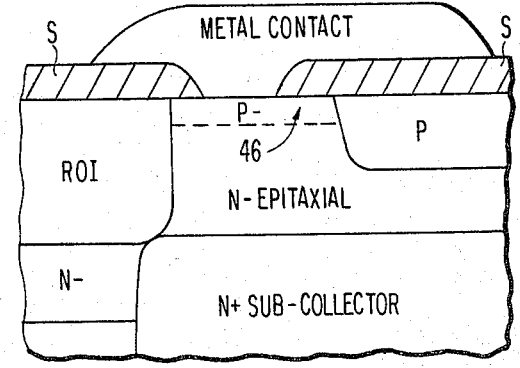
FIG.1D
FIG.1E
FIG.1F
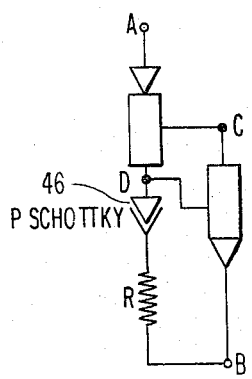
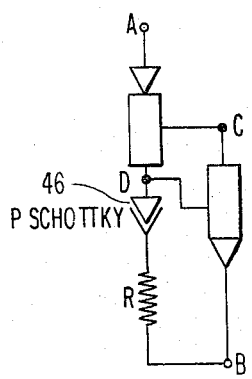

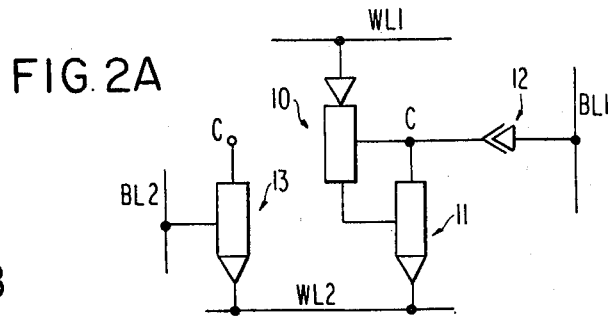
FIG. 2A
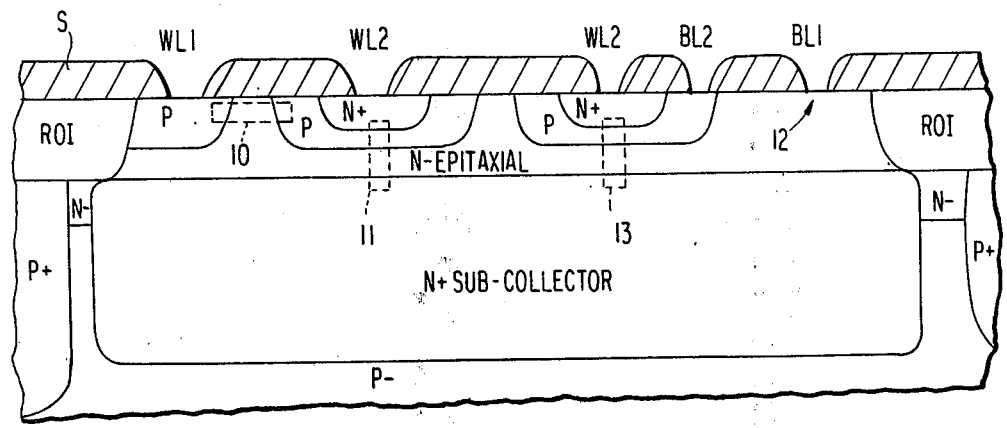
FIG. 2B
FIG. 3A
FIG. 3B

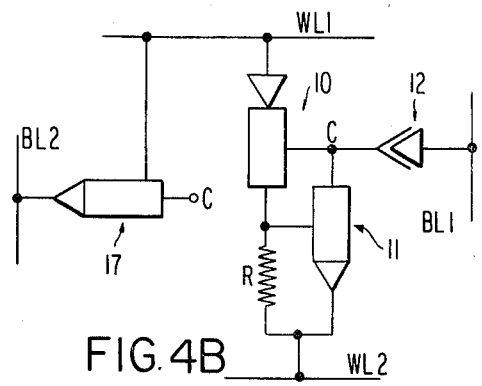
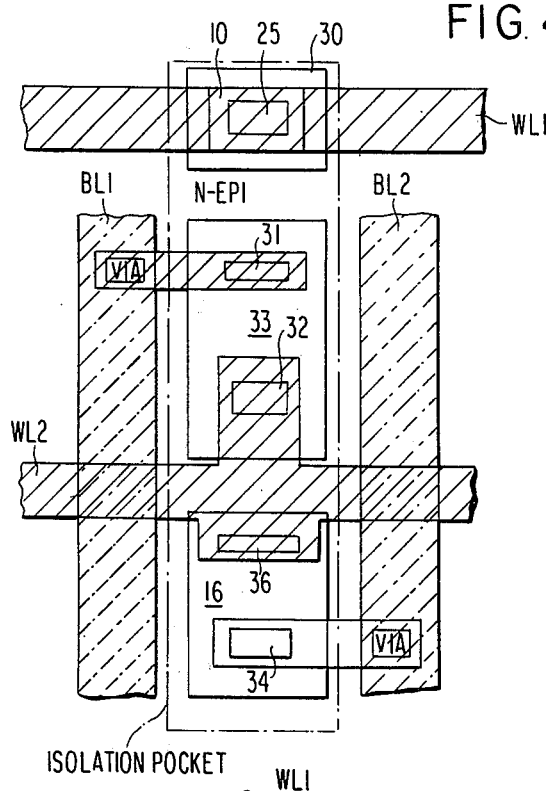
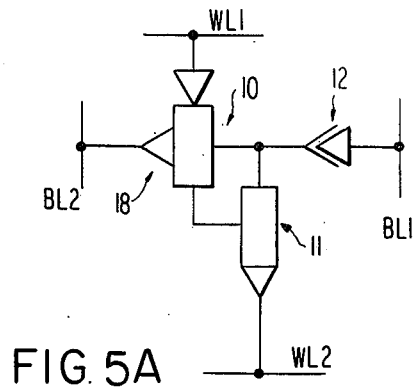
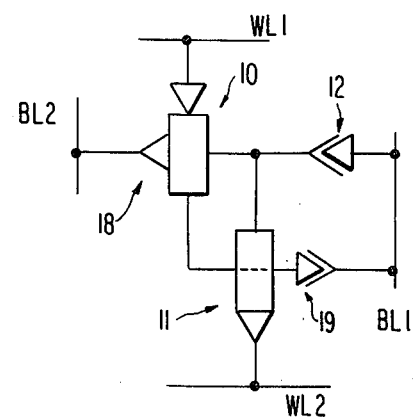
FIG. 4A  FIG. 4B  FIG. 4C  FIG. 5A  FIG. 5B  FIG. 5C

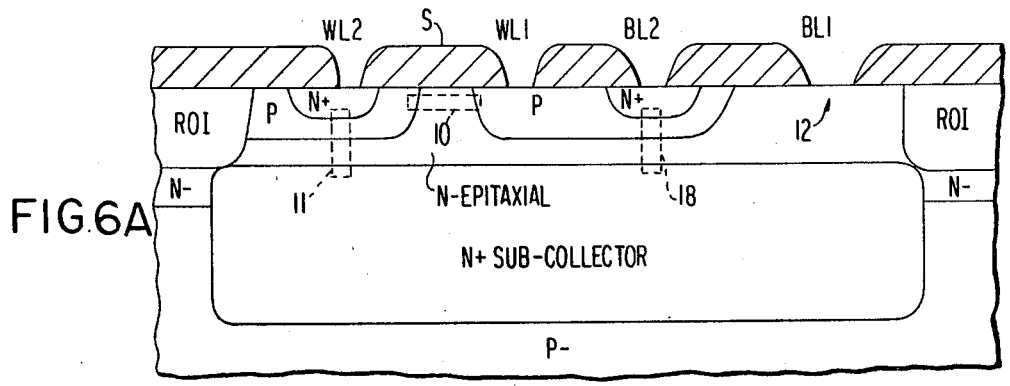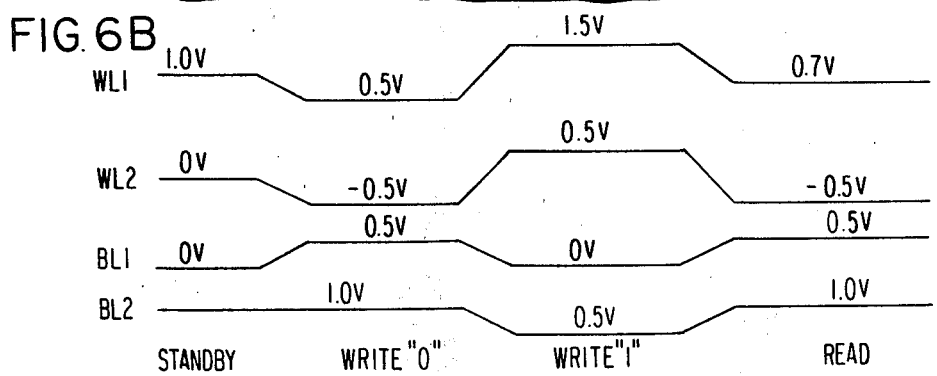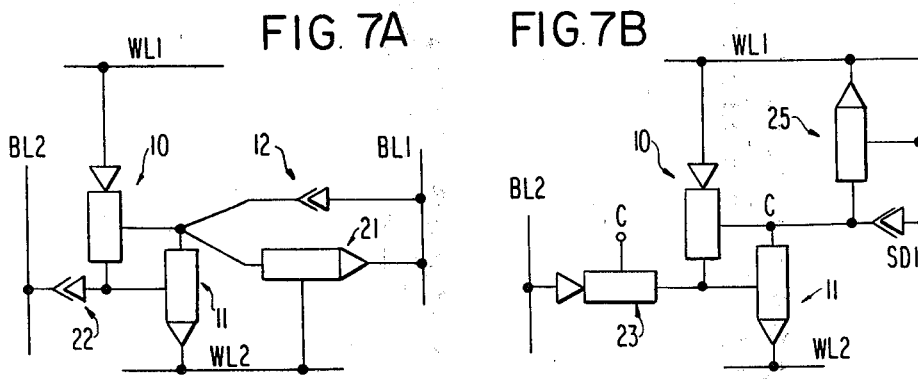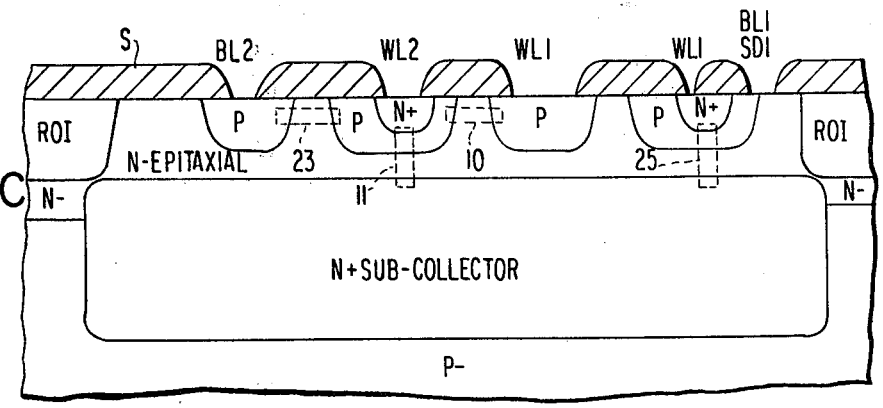

SINGLE ISOLATION CELL FOR DC STABLE MEMORY

DESCRIPTION

1. Technical Field

The present invention relates to static bipolar memory cells, and more particularly to improved memory cells which conserve on chip area without unduly complicating reading or writing, and without sacrificing noise margins.

2. Background Art

In the field of bipolar memory cells, there are a variety of integrated circuits shown in the prior art which, in varying degrees, meet different criteria which can be applied. Some of these criteria include minimizing the chip area required for each cell, thus increasing packing density; minimizing power consumption; exhibiting acceptable noise margins; operating with relatively simple peripheral circuits; operating with relatively simple reading and writing procedures; and being fully selectable.

The prior art in bipolar memory cells can be conveniently divided into dynamic cells and static cells, the static cells have the advantage of not requiring repeated refreshment or regeneration, whereas this is required for the dynamic cells. The present invention is directed to improvements in static cells, therefore the remaining part of this application will address only static cells.

By far the most common types of static cells suggested in the prior art were symmetrical, in which each cell was made up of a pair of circuits or device combination, each of which was DC stable. Typical are "Lateral PNP Design for Memory Cell" appearing in *IBM Technical Disclosure*, Volume 17, No. 6 (November, 1974) at pages 1619-1620 by Dorler et al, and "Complimentary Transistor Switch Memory Cell" by Dorler et al in *IBM Technical Disclosure*, Volume 16, No. 12 (May, 1974) pages 3931-3932. In this regard see also Ohhinata U.S. Pat. No. 4,066,915 and Goser U.S. Pat. No. 3,975,718. Somewhat related is the D.C. Stable Single Device Memory Cell disclosed in my U.S. Pat. No. 3,914,749, assigned to the assignee of this application. In U.S. Pat. No. 3,914,749 the single device is an NPN transistor. Goser discloses a FET memory cell which is economical in use of area, but requires a relatively complex writing operation. Finally, in "Single Device DC Memory Cell" appearing in the *IBM Technical Disclosure*, Volume 20, No. 9 (February, 1978) pages 3492-94 a single device DC stable memory cell is disclosed. This cell can be considered equivalent to an SCR latch in that is comprises a PNPN device which can be latched in either of two states. However, while exhibiting some advantageous characteristics, the cell is not fully selectable, and the write operation is relatively more complex than otherwise desirable.

It is one object of the present invention to attain the advantages of the aforementioned single device DC stable memory cell, while at the same time improving that cell so as to simplify reading and writing operations. It is another object of the present invention to provide a DC stable memory cell which is relatively simple in reading and writing operation, but which does not lose the packing density advantages of the last-mentioned TDB (IBM Technical Disclosure Bulletin).

The half cell, i.e., the single device DC stable memory cell of the last-mentioned TDB, and variants thereof are particularly advantageous in that the entire cell can be enclosed in a single isolated region or isolation pocket. In present day bipolar technology, a multi-element device such as that shown in the referred to TDB can occupy an area for the active devices which is relatively small, but the necessary isolation actually occupies an area that is significantly larger than the area occupied by the active devices. Prior art complementary or symmetrical memory cells thus paid a significant price by requiring two isolation pockets, as compared to the single isolation pocket for memory cells such as shown in the referred to TDB, and as described herein.

The significant disadvantage of the memory cell in the referred to TDB is the complexity of reading and writing, as well as the fact that the cell is not fully selectable, i.e., as described in the TDB, the cell is cleared before writing, and this of course, requires additional peripheral circuits to maintain the status of the cell prior to re-writing so that the data the cell initially stored is not lost in the event the particular cell is not to be written.

SUMMARY OF THE INVENTION

Accordingly, in accordance with one aspect of the invention, an interface comprising additional devices is provided to simplify the reading and writing operations for cells of the type described in the referred to TDB. While a variety of such devices can be added, due attention must be paid to the ability to integrate these added devices into the cell without requiring additional isolation, and minimizing the number of additional process steps required for these additional devices. Thus, in accordance with this aspect of the invention, a fully selectable static memory cell capable of writing either one of two information states or reading either one of two information states comprises, a paid of word lines, an SCR latch comprising an NPN device and an associated parasitic PNP device connected between said pair of word lines, interface means for reading and writing including means coupling first and second bit lines to said latch for placing said latch into a first or second information state regardless of its pre-existing state in response to selective alteration of the voltage states of said bit and word lines, and means coupled to one of said bit lines and to said latch for establishing a distinctive current level on said one bit line in response to selective alteration of the voltage state of at least one word line, said current level indicative of the information state of said latch.

In accordance with another aspect, the invention provides a fully selectable static memory cell capable of writing either one of two information states or reading either one of two information states comprising a substrate supporting a P-type semiconductor.

means for isolating a region of said semiconductor,
an N+ sub-collector within said isolated region,
a first NPN transistor within said region including said sub-collector,
a parasitic PNP transistor within said region, said parasitic PNP transistor including at least two elements in common with said NPN transistor,
controllable word and bit lines in said isolated region, and means coupling said word and bit lines to said first and second transistors for operating said transistors as an SCR latch to read the information state of said latch or to write either of said information states regardless of the pre-existing state of said latch in response to read and write signals on said word and bit lines.

More specifically, the geometry of the SCR latch within the isolated region includes a buried sub-collector (N+), and N− epitaxial layer, a pair of P-type base regions diffused in said epitaxial layer, said P-type diffused regions having adjacent edges separated by a sufficiently small distance so that the diffused P-type regions and the intervening N− epitaxial layer form a lateral PNP transistor, and an N+ diffused region located within one of the P-type diffused regions, so that the epitaxial layer and sub-collector, said one diffused P-type region and said latter diffused N+ region form an NPN transistor. Because of the geometry, the NPN and PNP transistors have at least one P-type region in common, the base of the NPN transistor and the collector of the PNP transistor, as well as the epitaxial region which is the collector of the NPN transistor and the base of the PNP transistor. Accordingly, the above-described device performs the function of a PNPN device or an SCR latch. Thus, the SCR latch of the inventive cell may have a single emitter NPN transistor as compared to the double emitter of the TDB. Word lines are connected to power the SCR latch and bit lines are connected through additional circuitry to allow ready reading and writing.

In a preferred embodiment of the invention, reading and writing is facilitated by the addition of a Schottky diode coupling one of the bit lines to the NPN collector-PNP base, and an additional NPN transistor having a collector in common with the collector of the first NPN transistor and a base connected to a second bit line. The added diode and NPN transistor enable relatively easy reading and writing and integrate simply into the geometry; the diode merely requiring a metal in contact with the epitaxial layer, the second NPN transistor requiring an additional diffused P-type region within the epitaxial layer and an N+ diffusion in the latter diffused P region.

Alternatively, the latter NPN transistor can be replaced by a second Schottky diode, although of the P-type.

As a further alternative, the N-type Schottky diode can be replaced by an NPN transistor.

In another embodiment of the invention simply adding a second NPN transistor to the referred to IBM TDB enables simple reading and writing.

Another embodiment of the invention adds a second N+ emitter to the PNP transistor to thus form a second parasitic NPN transistor having a P base in common with the P-type emitter of the PNP transistor and an N collector in common with the N base of the PNP transistor. In this embodiment of the invention an N-type Schottky diode is also added as in the first embodiment of the invention. The disadvantage of this embodiment is a relatively complicated writing cycle. However, this can be eliminated by the addition of a further Schottky diode coupled between the base of the NPN transistor and the anode of the N-type Schottky diode. A similar effect can be achieved by eliminating the N-type Schottky diode (as well as the P-type Schottky diode) and changing the single emitter NPN transistor to be a double emitter NPN transistor. As a further alternative, rather than using a double emitter NPN transistor, two NPN transistors (with common collector) are employed, the second NPN transistor is used in reading and writing by connecting its base to a bit line.

BRIEF DESCRIPTION OF THE DRAWINGS

Several specific embodiments of the invention will now be described in the following portions of this specification when read in conjunction with the attached drawings in which like reference characters identify identical apparatus, and in which:

FIG. 1A is an end view of a partially completed integrated circuit comprising an SCR latch which is a basic component of several embodiments.

FIG. 1B is a schematic of the device of FIG. 1A;

FIGS. 1C and 1D are enlarged portions of FIG. 1A showing integration of N-type and P-type Schottky diodes;

FIGS. 1E and 1F are schematics of the FIG. 1A device as modified by FIGS. 1C and 1D, respectively;

FIGS. 2A and 2B are schematic and end view of a preferred embodiment;

FIGS. 3A and 3B are similar illustrations of another embodiment;

FIGS. 4A, 4B, 5A, 5B and 5C are schematics of further embodiments;

FIG. 4C is a plan view of the device of FIG. 4A;

FIG. 6A is an end view of the embodiment of FIG. 5A;

FIG. 6B shows the wave forms used in reading and writing with the embodiment of FIG. 5A;

FIGS. 7A and 7B are schematics for still further embodiments of the invention; and FIG. 7C is an end view of a device corresponding to FIG. 7B.

BEST MODE FOR CARRYING OUT THE INVENTION

FIG. 1A is an end view of a basic component of the memory cell of the various embodiments described hereinafter, and FIG. 1B is a corresponding circuit schematic. As is well known to those skilled in the art, each semi-conductor chip actually includes an array of memory cells, thus the drawings and schematics herein will illustrate the unit cell which is replicated many times in the array. Thus, as shown in FIG. 1A, each cell is built up on a common P− substrate. For each cell a N+ sub-collector region is diffused, along with spaced P+ isolation regions. The N− epitaxial layer is grown over the entire chip. Selected regions at the boundaries of each cell are opened up for the deposition of isolation, shown in FIG. 1A as recessed oxide isolation (ROI). Thus, within the outboard ROI regions in FIG. 1A is a single isolation region. A pair of P-type impurity regions are provided, suitably separated. As will be described, the P-type regions may be adjacent to the cell boundary isolator (ROI). The P-type regions may be located directly adjacent the ROI, or a suitable space may be provided for the inclusion of one or more additional elements as will be described. One of the P-type regions has diffused therein a N+ region. The foregoing geometry provides for first NPN transistor 11, shown dotted in FIG. 1A, and a lateral PNP transistor 10 (also shown dotted in FIG. 1A). Note that the transistor 10 and 11 include a common P region, the base of the NPN transistor and the collector of the PNP transistor, as well as a common N region, the collector of the NPN transistor and the base of the PNP transistor. The foregoing circuitry is illustrated schematically in FIG. 1B. Note that the terminals labeled A,B,C, and D in FIG. 1B correspond to the areas carrying the same reference characters in FIG. 1A, and each of these areas is available for connection.

While the circuit of FIG. 1B will exhibit an SCR latching function, in that, when biased appropriately, and when the transistors 10 and 11 are conducting, they will remain conducting and likewise, this conduction can be terminated by terminating the conduction in the NPN transistor, which will terminate conduction in the PNP transistor, and the later state is also stable. For convenience we may refer to the "on" state or "1" state as that state of the cell in which it conducts current and the "off" state or "0" state as that state of the cell in which it does not conduct current. Thus the latch is capable of maintaining either of the two information states, "1" and "0".

While this arrangement exhibits some of the characteristics necessary for a memory cell, it actually has limited noise margin in that, when connected in circuit, spurious effects may turn on a latch which had been in the off condition, even in the absence of a signal designed to turn it on. Therefore, in order to increase the noise margin, that is, to prevent spurious switching from the zero to the one state, an impedance can be added to the circuit of FIG. 1B.

The impedance referred to, for improving the noise margin, can be connected in series between the points A and C, or it can be connected in series between points D and B. One suitable form of such an impedance is a polysilicon resistance.

Alternatively, an N-type Schottky diode 45 connected between points A and C, or a P-type Schottky diode 46 connected between points D and B can be used.

FIGS. 1C through 1F illustrate how this is effected. FIG. 1C is a detailed end view of a portion of FIG. 1A, shown within the dot-dashed area labeled FIG. 1C in FIG. 1A. As is shown in FIG. 1C, the geometry of FIG. 1A has been altered so that the emitter region of the PNP transistor 10 is separated from the isolator region, allowing the epitaxial N⁻ layer to reach the surface. A metal contact, for example, platinum (which when sintered forms platinum silicide) is deposited on the surface through a window in a passivation layer S. The platinum-epitaxial interface will exhibit diode characteristics, i.e., a forward drop of about 0.5 v is required to initiate conduction and current flow in the reverse direction will be subjected to a very large resistance. Since a conductor will be required for connection to terminal A, the provision of the Schottky diode reduces to a requirement for the use of a particular metal contact, and the particular geometry as shown in FIG. 1C. Thus, the N-Schottky diode 45 is implemented at relatively low cost. Ion implantation of boron in the epitaxial layer can be used to enhance the value of Schottky diode resistance, if desired.

In the alternative, a P-type Schottky diode 46 can be used as the impedance between terminals D and B. This is effected in the manner as shown in FIG. 1D which illustrates an enlarged portion of the end view of FIG. 1A which is shown dotted in FIG. 1A and carries the reference FIG. 1D. Thus, as shown in FIG. 1D, the P-type region which forms the base of NPN transistor 11 is separated from the isolator, allowing the N⁻ epitaxial layer to reach the surface. A lightly doped P⁻ region is provided adjacent the P base of the NPN transistor 11, for example by ion implantation. Thereafter, a metal contact, titanium or hafnium is laid down over the P-type region. The interaction of the metal and the P⁻ impurity provides the effect of a diode 46 which is connected to terminal B.

In addition to the diode action, by suitable choosing the lateral dimension (of either the platinum contact over the epitaxial region, or the titanium or hafnium contact over the P⁻ region) a parasitic resistance is included. Accordingly, when FIG. 1A is modified as shown in FIG. 1C, the schematic of FIG. 1E represents the electrical effect. FIG. 1E is identical to FIG. 1B except that an N-type Schottky diode 45 is included between the terminals A and C, along with a series parasitic resistance R. On the other hand, a similar effect can be provided if FIG. 1A is modified as shown in FIG. 1D, and in this case, the schematic of FIG. 1F shows the electrical effect. As is shown in FIG. 1F, the schematic is identical to FIG. 1B except that, between terminals D and B a P-type Schottky diode 46 is included with a parasitic resistance R. In either case, in the off state the terminal C or D, tends to approach the potential of terminal A or B respectively. For example, taking the schematic of FIG. 1F, spurious voltages which would switch the cell from an off to an on state, would necessarily raise the base of the NPN transistor 11, but now the Schottky diode 46 limits the excursion. Similarly, the N-type Schottky diode 45 of FIG. 1E limits the negative excursion of the base of the PNP transistor 10 with respect to its emitter. Either modification of the circuit of FIG. 1B will improve the noise margin, i.e., improve the immunity of the circuit from spuriously switching from an off to an on state. In the remaining embodiments of the invention, the noise margin improvement provided by a selected impedance (pure resistance, diode or diode-resistance combination) will not be explicitly illustrated, but it should be understood that such a noise margin improvement technique is preferred.

In the following portion of the specification, various embodiments of the invention are described. The variations have different advantages and drawbacks and accordingly an embodiment can only be selected for use with knowledge of other constraints. For example, some embodiments integrate well into small areas but require complex writing procedures while others are simple to operate but require more area or add complexity in fabrication. Obviously, in any given situation, some considerations will be more important than others, and these considerations will govern selection of a particular embodiment for that application.

FIG. 2A is a schematic of the preferred embodiment of the invention (omitting, as had been referred to above, one of the preferred noise margin improvement techniques shown in FIGS. 1C–1F).

As shown in FIG. 2A the basic SCR latch comprising transistors 10 and 11 is connected between a word line 1 (connected to the emitter of transistor 10) and a word line 2, connected to the emitter of transistor 11. An N-type Schottky diode 12, has a cathode connected to the collector of transistor 11 (terminal C) and an anode connected to bit line 1. In addition, a second NPN transistor 13, also has its emitter connected to word line 2, its collector in common with transistor 11, and its base connected to a second bit line, bit line 2. FIG. 2B is an example of how the device of FIG. 2A is integrated in one isolation pocket, that is more particularly, the transistor 10 comprises a lateral transistor with a P-type emitter, and N-type base and a P-type collector, shown dotted in FIG. 2B. The emitter of transistor 10 can connect to a contact labeled WL1 (word line 1) through the hole labeled WL1 in the passivation layer S. The transistor 11 exists between an N+ emitter surrounded by a P-type base (the collector of transistor 10) and an N-type collector comprising the N− epitaxial layer and the N+ sub-collector. The emitter of transistor 11 can contact WL2 (word line 2) through the hole in the passivation layer S. The transistor 13 exists between an adjacent N+ region diffused into a P-type region, and includes the N− epitaxial layer, and N+ sub-collector, as the combined collector. The emitter of transistor 13 also can contact WL2. Bit line 2 can connect to the base (P-type) region of transistor 13. Finally, the Schottky diode 12 is formed by a platinum contact overlying the N− epitaxial layer in the location designated BL1.

Table 1, reproduced below shows approximate voltage levels on the word and bit lines for standby, write "1", write "0" and read operations. It should be emphasized that these are exemplary and changes may be made by those skilled in the art to suit various needs.

TABLE 1

| Line | Standby | Write "1" | Write "0" | Read |
| --- | --- | --- | --- | --- |
| WL1 | +1.0 | +0.5 | +0.5 | +0.7 |
| WL2 | 0 | −0.5 | −0.5 | −0.5 |
| BL1 | 0 | 0 | +0.5 | +0.5 |
| BL2 | 0 | +0.5 | 0 | 0 |

Writing into the cell of FIGS. 2A and 2B can be effected whether or not the cell is latched on or off. In particular, writing requires reducing the voltage on both word lines (WL1 and WL2). In this condition raising the potential on BL1 will have the effect of draining any current from the base of transistor 10 or the collector of transistor 11, and will result in turning the SCR "off". For convenience we refer to this as writing a "0". To write a "1", bit line 2 is raised. This will tend to cause transistor 13 to conduct and its current conduction will cause the SCR to latch on, referred to as writing a "1". Once written, the word and bit lines can be returned to their quiescent conditions and the latch will remain in the state to which it was written. Reading the cell is effected by bringing down the word lines (the difference in word line voltages may be increased simultaneously which has the effect of powering up the cell) and sensing current in bit line 1 which is raised in potential. In the event that the cell had been latched on, the collector will be at a relatively low potential and thus will sink current from bit line 1. If the cell had been latched off, on the other hand, no or relatively little current would be sinked from bit line 1 under these conditions.

While the cell shown in FIGS. 2A and 2B has an additional transistor 13 and diode 12, as opposed to the basic SCR latch, as shown in FIG. 2B, these devices integrate well and thus require little additional area. On the other hand, these additional devices enable the cell to be written into and read from relatively rapidly, with simple operating voltage levels on the word and bit lines. The cell is fully selectable in that any cell strung along the word line can be selected for reading or writing and a "1" or "0" can be written regardless of the cell's prior state.

FIGS. 3A and 3B illustrate a variation on the cell of FIGS. 2A and 2B. As shown in FIGS. 3A and 3B the NPN transistor 13 has been eliminated, and is replaced by a P-type Schottky diode 14; in all other respects this cell is identical. The P-type Schottky diode 14 is implemented with a P-type diffusion in the same sub-collector bed as the SCR latch.

All the cells of a word line are initially turned on to state "1" by increasing the voltage on WL1. Thereafter, returning the word line 1 to its standby potential will leave the latch "on". On the other hand, with the word lines up, lowering bit line 2, will cause any conduction in the latch to terminate, thus corresponding to writing a "0". With the word lines, or at least word line 2, pulled down below its standby potential, the latch can be "read" by sensing current condition in bit line 1 when the voltage is increased. Bit line 1 will conduct current only when the latch is "on", and will not conduct, or conduct only negible current if the latch is "off".

FIG. 4A shows a further variant in which the P-type Schottky diode 14 has been eliminated, and an NPN transistor 16 inserted. As opposed to the NPN transistor 13 of FIG. 2A, the NPN transistor of FIG. 4A has its emitter coupled to bit line 2, and its base coupled to an emitter of transistor 11. In addition, the Schottky diode 12 has been replaced by a second emitter on transistor 11 which is coupled to bit line 1. A plan view of this device is shown as FIG. 4C.

As shown in FIG. 4C the connection between the P-type base of transistor 16 and the N-type emitter 32 of transistor 11 is effected by conductor 36 which is part of WL2. Also shown in FIG. 4C is the transistor 10 with emitter 30 contacting WL1. As in other embodiments the base of transistor 10 is the N− epitaxial layer and the collector is in common with the base 33 of transistor 11. The transistor 11 has an emitter 31 connected to BL1 and an emitter 32 connected to WL2. The transistor 16 has an emitter 34 connected to BL2 and a base 36 connected to WL2. FIG. 4C also shows N-type Schottky diode 25 connected to WL1, as in FIGS. 1C and 1E. A hole is left in the middle of emitter 30 of PNP transmitter 10 for this purpose.

Table 2, reproduced below, illustrates approximate voltages on the word and bit lines for standby, reading, writing "1" and writing "0". The values given in Table 2, like Table 1 are exemplary only.

TABLE 2

| Line | Standby | Write "1" | Write "0" | Read |
| --- | --- | --- | --- | --- |
| WL1 | 1.0 | 1.0 | 1.0 | 1.0 |
| WL2 | 0 | 0.5 | 0.5 | 0.5 |
| BL1 | 0.5 | 0.5 | 0.5 | 0 |
| BL2 | 0.5 | −0.5 | 0.5 | 0.5 |

To operate this cell, raising the word line 2 is effected. Unless the potential on bit line 1 or 2 is changed, this will terminate any conduction in the latch, and hence have the effect of writing a "0". On the other hand, lowering bit line 2 will cause transistor 16 to conduct and initiate conduction in the latch; thereafter returning the bit and word lines to their standby conditions, will leave the latch in an "on" condition. Reading the condition of the cell is effected by raising the word line 2 and dropping bit line 1. If the cell is latched "on" current will flow in bit line 1, on the other hand, if the latch is "off", no current or only negible current will be flowing in bit line 1.

A further alternative is shown in FIG. 4B. FIG. 4B is similar to FIG. 2A. However, NPN transistor 13 has been deleted, and its place taken by NPN transistor 17, with an emitter coupled to bit line 2, and base coupled to word line 1. In addition, an impedance, such as a resistance has been inserted between emitter and base of transistor 11. During standby WL1 and BL2 are about 1.0 v, while WL2 and BL1 are at 0 v.

Operation of this cell is relatively more complex than the operation of the previous embodiments as will be explained. Either a "1" or a "0" can be written into the cell regardless of its pre-existing condition. A "1" is written by raising both word lines and dropping bit line 2. This has the effect of initiating conduction which is latched up so that the cell remains conductive when the word and bit lines are returned to their standby levels. Alternatively, a "0" can be written in the cell as in the previous cases by lowering the word lines and raising bit line 1.

Reading is effected by bringing down the word lines and sensing the current in bit line 1 as in the embodiments of FIGS. 2A and 3A.

The complexity in operation of the cells should be apparent, in that writing a "1" requires raising the word lines and writing a "0" requires dropping the word lines. This has the effect of requiring a write cycle in which the word lines are both raised and lowered, in the general case so that any selected cell can be written with a "1" or a "0" by merely operating on the bit lines. With all other parameters equal, thus the write cycle is relatively longer than the write cycles of other embodiments.

FIGS. 5A-5E all incorporate the same variation on the basic SCR latch. More particularly, in addition to the latch (transistors 10 and 11) a second NPN transistor 18 is integrated with PNP transistor 10, such that the emitter of PNP transistor 10 is the base of the new NPN transistor 18 and the base of the PNP transistor 10 is the collector of the new NPN transistor. In the sense that common regions are employed for the transistor 10 and the new transistor, the new transistor can be termed at least a quasi-parasitic element in that its integration requires only an additional N emitter region. FIG. 6A is a sketch of a cross-section of the geometry of a cell whose schematic is shown in FIG. 5A, illustrating how the integration is effected. FIG. 6A shows the basic latch comprising transistors 10 and 11 as including a sub-collector N+ and adjacent N− epitaxial layer, including a first P-type diffusion in which a second N+ diffusion region exists, forming the NPN transistor 11. A second P-type diffusion region is provided adjacent the P-type region comprising the base of the NPN transistor 11, so that the two P-type diffusion regions separated by the N− epitaxial layer form the PNP transistor 10. This latter P-type diffusion region includes an additional N+ diffusion region such that this latter N+ diffusion region, the P-type diffusion region in which it exists and the associated epitaxial layer N− and sub-collector N+ form the additional NPN transistor 18. The Schottky diode 12 is formed as in the case of FIG. 3B via the bit line 1 contact overlying the N− epitaxial layer; by selecting the contact material of bit line 1 (platinum) the desired N-type Schottky diode is formed.

The cell whose schematic is shown in FIG. 5A can be operated to read or write, and can reliably store one of two information states, as in the case of the other cells, by latching the SCR on to store a "1" or off to store a "0". More particularly, reading can be effected by lowering the word lines, and raising bit line 1; if the cell is latched "on" then bit line 1 will draw current, otherwise it will not, or draw only negible current. Thus, the state of the cell can be determined by the quantum of current sinked by NPN transistor 11 from BL1.

Writing a "1" is effected by raising the word lines and lowering the bit line 2. In this state, the transistor 18 will initiate conduction and as a result of this, the cell will latch "on", so that when the word and bit lines are returned to their standby condition, the cell will be latched "on". On the other hand, writing a "0" is effected by lowering the word lines and raising bit line 1; this will have the effect of blocking current in the cell, had it been conducting current, to thereby ensure that when the word and bit lines are returned to their standby condition, the cell will not be conducting, i.e., latched "off".

FIG. 6B illustrates the wave forms for the writing operation. As in the case with FIG. 4B, since writing a 1 or a 0 requires different potentials on the word lines, the write cycle is relatively longer than other write cycles in which a 1 or a 0 can be written by merely selectively operating on the bit lines alone.

The write cycle of the cell of FIG. 5A can be improved, at the expense of adding an additional element, as shown in FIG. 5B.

The schematic of FIG. 5B shows a cell essentially similar to the schematic of FIG. 5A except that an additional P-type Schottky diode 19 has been added connected between the base NPN transistor 11 (its anode) and bit line 1 (its cathode). The geometry of this embodiment will be apparent to those skilled in the art and accordingly, a drawing representing this particular cell is omitted.

WL1 is normally at 1.0 v, W12 at 0 v, BL1 at 0.4 v and BL2 at 1.0 v.

Operation of the cell is as follows.

Reading is effected as reading the cell of FIG. 5A namely, the word lines are lowered and bit line 1 is raised, and the current sinked by transistor 11 is sensed in BL1; sinking of significant current indicates the cell is latched "on", sinking no or negible current indicates the cell is latched "off".

This particular cell has its writing operation simplified in that writing either a 1 or a 0 requires raising the word lines. A one is written as in the case of the schematic of FIG. 5A namely, by lowering bit line 2, to initiate conduction. Writing a 0, however, can be effected by lowering bit line 1. The presence of the P-type Schottky diode 19, with bit line 1 lowered, sinks current away from transistor 11 to thereby turn that transistor "off", terminating any previous conduction and ensuring that the cell is latched "off".

A further variant on the cell whose schematic is shown in FIG. 5B, is shown in FIG. 5C.

In view of the previous discussion the manner in which the cell of 5C can be integrated should be apparent and therefore an end view of this cell is omitted. However, the cell includes the PNP transistor 10, its parasitic NPN transistor 18 as well as the NPN transistor 11. However, the NPN transistor 11 has been altered so that it now includes a second emitter 20, which second emitter is connected to bit line 1. This cell has the same advantage of the cell of FIG. 5B in that it is relatively simple to operate. Reading is effected by raising the word lines, lowering BL1 and sensing current in bit line 1. If the cell had been conducting, raising the word lines will transfer current from the first emitter of transistor 11 to the second emitter 20, and thus the current on the bit line will represent the state of the cell. The cell can be written also by raising the word lines, writing a "1" is effected again by lowering bit line 2 as in the case of the cell whose schematic is shown in FIG. 5B.

Writing a "0" can be effected with the word lines raised, by raising bit line 1. Raising the word line 2 transfers the cells' current, to the second emitter 20 of the NPN transistor 11, and raising bit line 1 blocks such current flow ensuring that the cell is latched "off". After current conduction terminates, the word and bit lines can be returned to their standby potentials, and the cell will retain the "off" state. In standby, WL1 and BL2 are at 1.0 v, WL2 at 0 v and BL1 at 0.5 v.

FIG. 7A illustrates still a further embodiment of the invention. As shown in FIG. 7A to the basic cell, comprising SCR latch of transistors 10 and 11, and the N-type Schottky diode 12, is added NPN transistor 21 with base connected to word line 2, an emitter connected to bit line 1; its collector is common to the collector of transistor 11; as well as a P-type Schottky diode 22 (whose anode is the collector of PNP transistor 10, and cathode is connected to the bit line 2).

Although the cell requires elements in addition to some of the other embodiments of the invention, it does have a simplified operation, and its integration is relatively straightforward with the exception of the P-type Schottky diode 22, which may require the use of otherwise unnecessary metalurgy for the bit line 2. Reading this cell is effected by lowering the word lines and raising bit line 1. As in the case of several of the other embodiments, lowering the word line voltage, and raising bit line 1 voltage will have the effect of sinking current via transistor 11 if the cell is latched "on". The cell thus can be read by the current drawn by bit line 1. Raising bit line 1 will not affect transistor 21, since its emitter is connected thereto.

Writing into the cell is effected by raising the word lines, writing a "0" is effected by lowering bit line 2. Lowering bit line 2 with the word lines raised has the effect of sinking current from the PNP transistor 10 through the P-type Schottky diode 22, and this draining of current will latch the cell "off", had it been conducting current. Thereafter, when the word and bit lines are returned to their normal potentials, the cell will be "off". On the other hand, a "1" is written by lowering bit line 1, in the presence of a raised potential on the word lines. This will have the effect of initiating conduction in transistor 21, and that current will be transferred to the latch. Thereafter, when the word and bit lines are returned to their standby potentials, the cell will be conducting, i.e., latched "on". During standby, WL2 and BL1 are at 0 v, WL1 and BL2 at about 1.0 v.

In a further variant of the embodiment shown in FIG. 7A, the transistor 21 can be replaced by the addition of a second emitter on transistor 11 along with a resistor between its base and emitter.

Finally, the last embodiment of the invention is illustrated in FIG. 7B.

Here we use two lateral PNP's 10 and 23 on the two sides of the base of NPN transistor 11. Also, another NPN transistor 25 has its emitter connected to WL1 and base to BL1; its collector is common to the collector of NPN transistor 11. Emitter of PNP 10 is connected to WL1, while the emitter of PNP 23 is connected to BL2 and anti-saturation clamp SD1 can also be used across the base and collector of NPN transistor 25.

During standby WL1 is at about 1.0 v, BL1 and WL2 at 0 v, and BL2 at 0.5 v.

To read both word lines are lowered by about 0.5 v while BL1 is raised to 0.5 v. If the cell is in the state "1", the collector c will be down and BL1 and will draw current through SD1. There will be no or negible current in BL1 if the cell is in state "0".

To write, WL1 and WL2 are dropped to −0.5 v. To write "0" BL1 and BL2 are at 0 v; a "1" is written if BL2 is at 0 v but BL1 is raised to 0.5 v to turn on transistor 25.

As is shown in FIG. 7C, four P-type regions are used, two of which have N-type regions therein. A first of these N-type regions is used for the NPN transistor 11 (in association with the N⁻ epitaxial layer and N+ sub-collector). Surrounding this P-type region are two further P-type regions which establish the two lateral PNP transistors, 10 and 23 respectively. Finally, a fourth P-type region with the second N-type region establishes the NPN transistor 25. The contact holes for WL1, WL2, BL1 and BL2 are shown, in the passivation layer S along with a contact hole for the anti-saturation clamp SD1.

Those skilled in the art will understand that many variations of the embodiments particularly described herein can be effected well within the skill of the art, and falling within the scope of the present invention. For example, many prior art memory cells include anti-saturation Schottky diode clamp to ensure that the NPN transistor of the latch does not saturate. It is within the scope of the present invention to incorporate such a Schottky diode, shown for example, in the referred TDB, FIG. 3 at SD2.

In addition, the present invention contemplates that a plurality of cells, each identical to a selected one of the embodiments shown herein, will be formed in a substrate and connected in parallel to a pair of word lines, with voltage or current sources at one or another end of the word lines. Because of path resistance, a problem may develop in that the cells closer to the source may tend to "hog" current. A typical solution to this problem is to include a relatively low resistance between the word line and the latch. Such a resistance could be inserted, for example, between word line 1 and the emitter of PNP transistor 10, or between word line 2 and the emitter of NPN transistor 11. This resistor is, of course, in addition to any further additions made to the cell, for purposes of increasing the cell noise margin, such as the additional device which may be connected between the collector of NPN transistor 11 and word line 1, or the collector of PNP transistor 10, and the word line 2, such devices being selected from the group consisting of a resistor, Schottky diode or resistor/-Schottky diode combination, in which the resistor can be parasitic. The resistance of the resistor associated with the Schottky diode may be increased, if desired, by local ion implant, as is well known.

Other and further variations will occur to those skilled in the art in the course of reviewing this description, and it should be understood that the specific embodiments are exemplary only, the scope of the invention is to be determined from the attached claims.

What is claimed is:

1. A fully selectable static memory cell capable of writing either one of two information states or reading either one of two information states and contained within a single isolated region comprising:

a substrate supporting a P-type semiconductor, means for isolating a region of said semiconductor, an N+ sub-collector within said isolated region, a first NPN transistor within said region including said sub-collector, a P-type NPN base region and an N-type NPN emitter region, a parasitic PNP transistor within said region, said parasitic PNP transistor including a base region comprising said NPN collector and a collector region comprising said NPN base region, controllable word and bit lines in said isolated region, and coupling means for coupling said word lines to said transistors and for coupling each of said bit lines to both said first and second transistors for operating said transistors as an SCR latch to read the information state of said latch or to write either of said information states regardless of the pre-existing state of said latch in response to read and write signals on said word and bit lines.

2. The device of claim 1 in which said coupling means includes a P-type Schottky diode comprising a one of said bit lines, said NPN collector region and a P-type implant in said NPN collector region, and an N-type Schottky diode comprising another of said bit lines and said NPN collector region.

3. The device of claim 1 in which said coupling means includes a second NPN transistor coupled to a first bit line and a second PNP transistor coupled to a second bit line, said second NPN transistor comprising a further N-type region in a further P-type region in said NPN collector, and means for connecting said first bit line to said further P-type region, said second PNP transistor comprising another P-type region in said NPN collector, and means for connecting said second bit line to said another P-type region.

4. The device of claim 3 which further includes an anti-saturation clamp connected to said second NPN transistor.

5. The device of claim 1 including noise margin improvement means coupled to one of said word lines and including a Schottky diode.

6. The device of claim 5 wherein said Schottky diode is a P-type Schottky diode.

7. The device of claim 5 wherein said Schottky diode is an N-type Schottky diode.

8. A fully selectable static memory cell formed in a single isolation region in a semi-conductor member and capable of writing a first or a second information state, or reading either one of two information states, comprising:

a pair of word lines, a pair of bit lines, an SCR latch, comprising an NPN device and an associated quasi-parasitic PNP device having common interconnection which form a pair of nodes, said latch being connected between said pair of word lines, interface means directly connected between the bit lines and the nodes for controlling the node potentials, said latch and said interface means being formed within said single isolation region, whereby said first or second information state is written into said SCR latch regardless of a pre-existing condition of said SCR latch or a distinctive current level is established in one of said bit lines, either action depending on selective alteration of potentials on said word and bit lines.

9. The apparatus of claim 8 which includes noise margin improvement means coupling said SCR latch to one of said word lines.

10. The apparatus of claim 8 which further includes noise margin improvement means including a Schottky diode coupled between said SCR latch and one of said word lines.

11. The apparatus of claim 10 in which said noise margin improvement means includes a P-type Schottky diode coupled between base and emitter of said NPN device.

12. The apparatus of claim 10 in which said noise margin improvement means comprises an N-type Schottky diode coupled between base and emitter of said PNP device.

13. The device of claim 8 wherein said interface means includes an N-type Schottky diode coupled between said SCR latch and a one of said bit lines.

14. The device of claim 13 in which said interface means further includes a PNP transistor with an emitter coupled to another of said bit lines and collector coupled to a collector of said PNP device.

15. The device of claim 8 in which said interface means includes a P-type Schottky diode coupled between one of said bit lines and a base of said NPN device.

16. The device of claim 15 in which said interface means further includes an N-type Schottky diode coupled between another of said bit lines and a collector of said NPN device.

* * * * *

UNITED STATES PATENT AND TRADEMARK OFFICE
CERTIFICATE OF CORRECTION

PATENT NO. : 4,409,673
DATED : October 11, 1983
INVENTOR(S) : Shashi D. Malaviya It is certified that error appears in the above—identified patent and that said Letters Patent is hereby corrected as shown below:

Col. 1, line 32-33, change "combination" to -combinations-;

line 52, change "is" to -it-.

Col. 2, line 36, change "paid" to -pair-;

line 54, change "." to -,-.

Col. 4, line 10, change "." to -;-;

line 61, change "transistor" to -transistors-.

Col. 6, line 3, change "suitable" to -suitably-;

line 19, delete "," after "D".

Col. 8, line 7, delete "," after "2";

line 11, change "condition" to -conduction;

UNITED STATES PATENT AND TRADEMARK OFFICE
CERTIFICATE OF CORRECTION

PATENT NO. : 4,409,673
DATED : October 11, 1983
INVENTOR(S) : Shashi D. Malaviya It is certified that error appears in the above—identified patent and that said Letters Patent is hereby corrected as shown below:

Col. 8, line 12, change "the" to --its--;

line 14, change "negible" to --negligible--;

line 62, change "negible" to --negligible--.

Col. 9, line 66, change "negible" to --negligible--.

Col. 10, line 25, after "base" insert --of--;

line 37, change "negible" to --negligible--.

Col. 11, line 24, change "metalurgy" to --metallurgy--.

Col. 12, line 1, change "negible" to --negligible--.

Signed and Sealed this

Third Day of January 1984

[SEAL]

Attest:

GERALD J. MOSSINGHOFF

Attesting Officer

Commissioner of Patents and Trademarks